United States Patent
Guha et al.

(10) Patent No.: US 7,517,465 B2
(45) Date of Patent: Apr. 14, 2009

(54) ULTRA LIGHTWEIGHT PHOTOVOLTAIC DEVICE AND METHOD FOR ITS MANUFACTURE

(75) Inventors: Subhendu Guha, Bloomfield Hills, MI (US); Arindam Banerjee, Bloomfield Hills, MI (US); Kevin Beernink, Clarkston, MI (US); Todd Johnson, Royal Oak, MI (US); Ginger Pietka, Harrison Township, MI (US); Gregory DeMaggio, Ann Arbor, MI (US); Shengzhong (Frank) Liu, Rochester Hills, MI (US); Jeffrey Yang, Troy, MI (US)

(73) Assignee: United Solar Ovonic LLC, Auburn Hills, MI (US)

( * ) Notice: Subject to any disclaimer, the term of this patent is extended or adjusted under 35 U.S.C. 154(b) by 446 days.

(21) Appl. No.: 11/254,838

(22) Filed: Oct. 20, 2005

(65) Prior Publication Data
US 2009/0075483 A1  Mar. 19, 2009

Related U.S. Application Data

(60) Provisional application No. 60/620,808, filed on Oct. 21, 2004.

(51) Int. Cl.
*B29D 11/00* (2006.01)
*H01L 31/06* (2006.01)

(52) U.S. Cl. .................. 216/24; 216/41; 216/83; 438/745; 136/243; 136/245; 136/251; 136/261; 136/262

(58) Field of Classification Search .............. 216/24, 216/41, 83; 136/243, 245, 251, 261, 262; 438/745
See application file for complete search history.

(56) References Cited

U.S. PATENT DOCUMENTS

| | | | | |
|---|---|---|---|---|
| 4,416,052 A | | 11/1983 | Stern | 29/572 |
| 4,754,544 A | * | 7/1988 | Hanak | 438/66 |
| 4,854,975 A | * | 8/1989 | Krause | 136/262 |
| 6,265,319 B1 | | 7/2001 | Jang | 438/723 |
| 6,555,443 B1 | | 4/2003 | Artmann et al. | 438/458 |
| 6,734,116 B2 | | 5/2004 | Guo et al. | 438/792 |
| 6,767,762 B2 | * | 7/2004 | Guha | 438/113 |
| 6,940,089 B2 | | 9/2005 | Cheng et al. | 257/19 |

FOREIGN PATENT DOCUMENTS

JP  2001-284611 A  * 10/2001

* cited by examiner

*Primary Examiner*—Shamim Ahmed
(74) *Attorney, Agent, or Firm*—Gifford, Krass, Sprinkle, Anderson & Citkowski, P.C.

(57) ABSTRACT

An ultra lightweight semiconductor device such as a photovoltaic device is fabricated on a non-etchable barrier layer which is disposed upon an etchable substrate. The device is contacted with an appropriate etchant for a period of time sufficient to remove at least a portion of the thickness of the substrate. The barrier layer prevents damage to the photovoltaic material during the etching process. Photovoltaic devices fabricated by this method have specific power levels in excess of 300 w/kg.

10 Claims, 1 Drawing Sheet

ULTRA LIGHTWEIGHT PHOTOVOLTAIC DEVICE AND METHOD FOR ITS MANUFACTURE

RELATED APPLICATION

This application claims priority of U.S. Provisional Patent Application Ser. No. 60/620,808 filed Oct. 21, 2004, entitled "Ultra Lightweight Electronic Device and Method for its Manufacture" which is incorporated herein by reference.

GOVERNMENT INTEREST

This invention was made with Government support under contract F29601-03-C-0122 awarded by Air Force Research Laboratory. The United States Government has certain rights in the invention.

FIELD OF THE INVENTION

This invention relates generally to photovoltaic and other electronic devices. More particularly, the invention relates to ultra lightweight photovoltaic devices and methods for their fabrication.

BACKGROUND OF THE INVENTION

Weight is a very important factor in many electronic device applications. For example, photovoltaic generator arrays are frequently used as power sources in aerospace and military applications where weight is at a premium. The weight of photovoltaic devices is also of significant concern in other mobile applications, and in those particular applications in which transport of massive items is difficult. Specific power is a property of photovoltaic generator devices and is expressed in the units of watts (w) per kilogram of generator weight. Conventional lightweight photovoltaic generators of the type employed in aerospace applications have a specific power rating of approximately 30-50 w/kg. Ultra lightweight photovoltaic generators which are based upon thin film semiconductor materials and which employ very lightweight substrates will exhibit specific power levels in the range of 500-1500 w/kg.

In many instances lightweight and ultra lightweight photovoltaic devices, as well as other lightweight electronic devices, are manufactured by a process which involves use of a stock starting material which is comprised of a body of electronically active material, such as a photovoltaic or other semiconductor material, disposed upon a substrate. Typically, the photovoltaic material is comprised of one or more submicron thick layers of thin film semiconductor materials including but not limited to hydrogenated group IV alloy materials, and the substrate is a relatively thick support member. One step in the fabrication of lightweight electronic devices involves etching away some, or all, of the thickness of the substrate layer so as to reduce the overall weight of the device. Such etching away is typically accomplished after the device has been subjected to a number of processing steps such as affixation of electrodes, front surface encapsulation and the like.

In order to achieve maximal weight reduction it is generally desirable to reduce the thickness of the substrate to the greatest extent possible. However, it has been found that as a practical matter it is very difficult to etch a substrate down to a thickness of less than one mil. A typical substrate material may include defects, contaminants, or regions of varying composition which result in non-uniform etching, and such features can cause the formation of pinholes, cracks, voids or the like in the etched substrate, and these defects can lead to delamination or other damage to adjacent portions of the electronically active material. This difficulty in etching substrates has placed a limitation upon the fabrication of lightweight and ultra lightweight semiconductor devices.

As will be explained in detail hereinbelow, use of the present invention overcomes problems of the prior art and allows for substrates of electronic devices to be etched to thicknesses of less than one mil thereby allowing for the manufacture of very lightweight devices.

BRIEF DESCRIPTION OF THE INVENTION

Disclosed herein is a method of making a lightweight photovoltaic device. The method involves employing a substrate for the device which is comprised of a material which is etchable by an etchant composition. A barrier layer is disposed on the substrate. The barrier layer is comprised of a material which is not etchable by the etchant which etches the substrate. A body of photovoltaically active material is disposed on the barrier layer, and the substrate is contacted with the etchant so as to etch away at least a portion of the thickness of the substrate. This method results in the production of an ultra lightweight photovoltaic device. In typical applications, the thickness of the substrate following etching is no more than 0.5 mil.

In specific instances, the substrate is fabricated from a metal, such as a ferrous alloy which is etchable by acidic material such as ferric chloride solutions. The barrier layer is comprised of a non-etchable material which may comprise a metal such as titanium or molybdenum, or non-metallic material such as carbon, ceramics, cermets and the like. In some instances, the barrier layer has a thickness in the range of 0.0001-0.5 mils. In some instances, the substrate may comprise a polymeric substrate, and the etchant may comprise a solvent for the polymer.

In particular embodiments, the photovoltaically active material is a thin film semiconductor material such as a group IV alloy material. In particular applications, the body of photovoltaically active material is configured to include at least one triad composed of a layer of substantially intrinsic semiconductor material interposed between oppositely doped layers of a semiconductor material. Also disclosed herein are devices fabricated according to the methods of the present invention.

DETAILED DESCRIPTION OF THE INVENTION

In accord with the present invention it has been found that an appropriate barrier layer of non-etchable material may be interposed between a substrate and a body of electronically active material. The barrier layer is very thin, but it is resistant to chemical etching. Accordingly, the barrier layer will allow for a substrate to be etched to a very small thickness, or even completely removed, without compromising the integrity of the remainder of the electronic device.

The present invention will be explained with reference to a photovoltaic device; however, it is to be understood that the principles of the present invention may be employed in connection with other types of electronic devices, particularly thin film semiconductor devices, including photoactive devices such as photosensors, photoconductors, light emitting devices and the like, as well as in conjunction with non-photoactive devices such as transistors, diodes, and integrated circuits.

Figure 1:
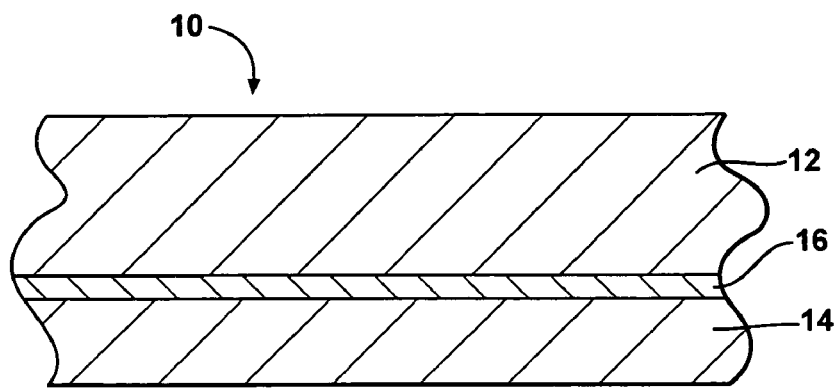
FIG. 1 is a cross-sectional view of a portion of a photovoltaic device in accord with the present invention prior to the etching of its substrate.

Referring now to FIG. 1, there is shown a portion of a photovoltaic device 10 of the type employed in the practice of the present invention. As described above, the device 10 includes a body of substrate material 12 which supports a body of photovoltaically active material 14. The photovoltaic material may comprise one or more p-i-n type photovoltaic devices each of which comprise a triad having a layer of substantially intrinsic semiconductor material interposed between oppositely doped layers of semiconductor material. As is known in the art, this triad, when exposed to appropriate illumination, generates a photovoltaic current which is collected by electrode structures which are in electrical communication with appropriate layers of the device. As is also known in the art, such devices can include current collecting grid wires, bodies of encapsulant material, reflective structures and the like, and for purposes of this discussion, such structures have not been shown.

Figure 2:
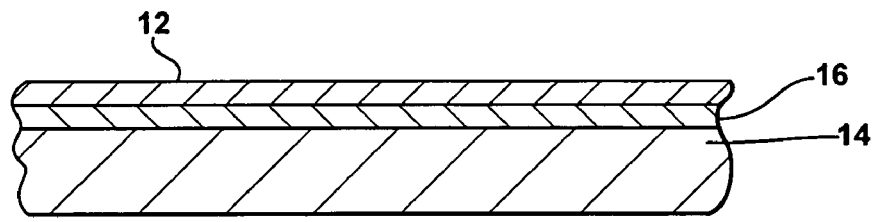
FIG. 2 is a cross-sectional view of the photovoltaic device of FIG. 1 after a portion of the substrate has been etched away.

In accord with the present invention, and as is distinct from the prior art, the device 10 shown in FIG. 1 further includes a barrier layer 16 interposed between the substrate 12 and the photovoltaically active body 14. The respective materials comprising the barrier layer 16 and substrate 12 are selected so that the substrate 12 is etchable by a particular etchant composition, while the barrier layer 16 is resistant to that etchant composition. It should be noted that in some instances a light reflective layer may be interposed between the barrier layer 16 and the photovoltaically active body 14. In a subsequent step of the present invention, and as is shown in FIG. 2, the substrate layer 12 is contacted with the etchant composition for a time sufficient to decrease the thickness of the substrate layer as desired. Typically, the substrate is etched down to 3 mil or less. As discussed above, irregularities in the substrate and/or the etching process could cause the development of cracks, pinholes or other defects in the substrate 12 if the thickness was decreased by too great of an extent. In accord with the present invention, the barrier layer 16 is resistant to the etchant; hence, any defects in the substrate layer 12 which occur as a result of the etching process will not penetrate the barrier layer and cause harm to the photovoltaically active body 14.

In one group of embodiments, the substrate 12 is electrically conductive and forms one terminal of the device. In such instances, it is generally desirable that the barrier layer 16 also be electrically conductive, at least to some degree, so as to allow for a flow of current therethrough. Since the barrier layer 16 is relatively thin, and the area of the device is relatively large, high electrical conductivity is not always required; therefore, barrier layers having sufficient electrical conductivity to permit function of the device may be comprised of materials such as metals having relatively high electrical resistivity, semiconductors, electrically conductive ceramics, electrically conductive polymers, cermets and the like. In other instances, the barrier layer may be electrically insulating, and appropriate current collecting and/or distribution structures may be associated with the active body 14.

In one specific application of the present invention, a photovoltaic device is fabricated from a photovoltaic body comprised of a number of thin film group IV semiconductor alloy layers, such as silicon-hydrogen, silicon-germanium-hydrogen and germanium-hydrogen alloy layers. This device includes a stainless steel substrate which is etchable by an acidic etchant such as a ferric chloride based solution. In this embodiment, an etchant-resistant metal such as titanium, molybdenum, gold, palladium, platinum, or tungsten, etc. may be employed as a barrier layer. Other materials such as carbon, silicon, ceramic material, metal oxides, polymer, etc. may also be used. In an application of this type, the substrate is etched down to a thickness of less than one mil, and the barrier layer has a thickness in the general range of 0.0001-0.5 mils. As will be appreciated, other configurations may be employed depending on particular applications.

In other instances, the substrate may comprise a body of a polymeric material, which is etchable by an etchant which may comprise an organic solvent, or by a caustic material such as phenol and/or an alkali. In yet other instances, the substrate may comprise an inorganic material such as a glass, a salt or the like. The barrier layer may, in some instances, comprise a polymeric material which can include an organic polymeric material as well as silicones and the like. The barrier layer may also comprise an inorganic material such as a ceramic, a glass, carbon, silicon, or a cermet. All of such embodiments are within the scope of the present invention.

In one specific example, a photovoltaic device having a specific power greater than 500 w/kg was prepared by fabricating a photovoltaic generator device on a 5 mil stainless steel substrate. This substrate was subsequently thinned down to a thickness of approximately 0.5 mil by the use of a ferric chloride based etchant. It has been found that even high quality photovoltaic grade stainless steel substrates have pinholes and defects therein which cause device failure when the substrate is thinned to a thickness in the range of 0.6 to 1.5 mils. These pinholes can allow the acid etchant to contact the cell surface, and a single pinhole is sufficient to cause cell failure and/or rejection for a large area device.

In accord with one implementation of the present invention, a substrate comprising a 14 by 15 inch rectangular piece of stainless steel was sputter coated with approximately 3400 angstroms of titanium. Thereafter, a silver back reflective layer was disposed upon the coated substrate, and a tandem photovoltaic device comprising three triads of p-i-n configuration was deposited thereatop. A top electrode comprised of a transparent electrically conductive oxide material was disposed-upon the photovoltaic device. Subsequently, the device was etched using a ferric chloride based solution so that the stainless steel substrate was thinned to a thickness of less than 3 mil. When devices not incorporating the barrier layer of the present invention are prepared by this process, they display a large number of pinholes when viewed in transmitted light. In contrast, devices of the present invention do not show any pinholes when viewed in transmitted light. When the devices of the present invention are viewed in reflected light, a number of reflective, metallic spots are seen. It is believed that these correspond to portions of the barrier layer visible through etchant-induced pinholes in the steel substrate.

The performance characteristics of the cell of the present invention were very good indicating that the titanium barrier layer prevented damage to the photovoltaic material during the etching process. Based upon these observations it is expected that titanium barrier layers having thicknesses of as little as 800 angstroms should provide adequate protection. It is further anticipated that other etchant resistant metals such as molybdenum, platinum, palladium, gold, carbon, silicon, lead and the like should give similar results.

Figure 3:
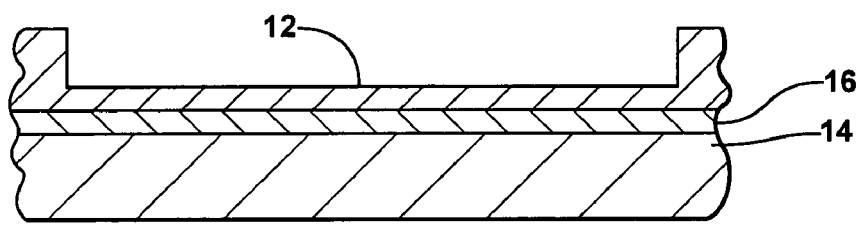
FIG. 3 is a cross-sectional view of a photovoltaic device generally similar to that of FIG. 1 in which only portions of the thickness of the substrate have been etched.

While FIG. 2 shows the entirety of the substrate being reduced in thickness, it will be appreciated that in some instances it is desirable to decrease the thickness of only selected portions of the substrate. For example, edge portions of the substrate may be unetched, or etched only to a small degree so as to provide reinforcement for the ultra thin device, as is shown in FIG. 3.

Figure 4:
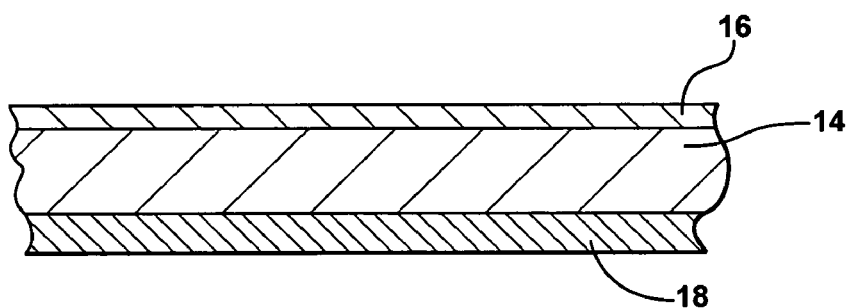
FIG. 4 is a cross-sectional view of another embodiment of ultra lightweight photovoltaic device prepared in accord with the present invention.

In other instances the entirety of the substrate will be etched away. In such embodiments, the device may include a transparent, front, encapsulating layer which provides integrity and support for the device. FIG. 4 shows a device wherein a body of encapsulant material 18 is disposed upon the front surface of a photovoltaic device. The encapsulant material is generally applied to the device prior to etching. In one specific instance, the encapsulant is a polymer which is spray coated on the device to a thickness in the range of 0.2-2 mil; although in other embodiments encapsulant layers in the general range of 0.01-5 mil are employed. Layers of this type provide environmental protection and mechanical integrity to the remaining portions of the device. It will be appreciated that such encapsulant layers can also extend so as to cover the substrate side of the device, and all of such encapsulant layer configurations may be utilized in the other embodiments of the invention shown and suggested herein.

While the foregoing description has been directed to photovoltaic devices, the principles of this invention are applicable to other semiconductor devices, and in particular to thin film semiconductor devices in which ultra lightweight embodiments are desired. In view of the teaching presented herein, yet other modifications and variations of the invention will be apparent to those of skill in the art. The foregoing is illustrative of particular embodiments, but is not meant to be a limitation upon the practice thereof. It is the following claims, including all equivalents, which define the scope of the invention.

The invention claimed is:

1. A method of making a lightweight photovoltaic device, said method comprising the steps of:
   providing a substrate comprised of a ferrous alloy material which is etchable by an acidic etchant composition;
   disposing a barrier layer on said substrate, said barrier layer comprised of a material which is not etchable by said etchant said material being selected from the group consisting of titanium, molybdenum and combinations thereof;
   disposing a body of photovoltaically active material, which includes at least one thin film layer of an alloy of silicon and hydrogen, which optionally includes at least one doping element, on said barrier layer; and
   etching away at least a portion of the thickness of the substrate by contacting said substrate with said etchant.

2. The method of claim 1, wherein said body of photovoltaically active material includes at least one triad comprised of a layer of substantially intrinsic semiconductor material interposed between oppositely doped layers of a semiconductor material.

3. The method of claim 1, including the further step of disposing a layer of a light reflective material atop said barrier layer prior to the step of disposing said body of photovoltaically active material thereupon.

4. The method of claim 1, wherein said barrier layer is comprised of a metal.

5. The method of claim 1, wherein the step of etching comprises etching away at least a portion of the thickness of the substrate in preselected areas of said substrate, so that in areas which have not been preselected, the resultant thickness of the substrate is greater than it is in the areas which have been selected.

6. The method of claim 1, including the further step of encapsulating at least a portion of said lightweight photovoltaic device in electrical communication with said body of photovoltaically active material.

7. The method of claim 1, including the further step of encapsulating at least a portion of said lightweight photovoltaic device in a protective material.

8. A method of making a lightweight, thin film photovoltaic device, said method comprising the steps of
   providing a substrate member, comprised of a ferrous alloy;
   disposing a barrier layer on said substrate, said barrier layer being comprised of a material selected from the group consisting of titanium, molybdenum, carbon, a ceramic, a cermet, and combinations thereof;
   providing an acidic etchant material which is capable of etching said substrate and not said barrier layer;
   disposing a body of photovoltaically active, thin film semiconductor material on said barrier layer, said body of photovoltaically active material including at least one triad comprised of a body of substantially intrinsic semiconductor material interposed between oppositely doped layers of semiconductor material; and
   contacting said substrate with said etchant so as to etch away at least a portion of the thickness of said substrate.

9. The method of claim 8, including the further step of disposing a layer of a light reflective material atop said barrier layer prior to the step of disposing said body of photovoltaically active material thereupon.

10. The method of claim 8, comprising etching away all of the thickness of the substrate.

* * * * *